US012663449B2

(12) United States Patent
Juge et al.

(10) Patent No.: US 12,663,449 B2
(45) Date of Patent: Jun. 23, 2026

(54) DEVICE FOR MEASURING TEMPERATURE GRADIENTS APPLIED TO A PRECISION CAPACITIVE DIVIDER VOLTAGE SENSOR

(71) Applicant: GE Infrastructure Technology LLC, Greenville, SC (US)

(72) Inventors: Patrice Juge, Aix-les-Bains (FR); Reto Christen, Oberentfelden (CH)

(73) Assignee: GE VERNOVA INFRASTRUCTURE TECHNOLOGY LLC, Greenville, SC (US)

( * ) Notice: Subject to any disclaimer, the term of this patent is extended or adjusted under 35 U.S.C. 154(b) by 129 days.

(21) Appl. No.: 18/591,512

(22) Filed: Feb. 29, 2024

(65) Prior Publication Data

US 2024/0295592 A1 Sep. 5, 2024

(30) Foreign Application Priority Data

Mar. 2, 2023 (EP) .................................... 23305277

(51) Int. Cl.
| | |
|---|---|
| *G01R 19/32* | (2006.01) |
| *G01K 3/06* | (2006.01) |
| *G01K 13/024* | (2021.01) |
| *G01R 15/16* | (2006.01) |
| *H02B 13/035* | (2006.01) |

(52) U.S. Cl.
CPC .............. *G01R 19/32* (2013.01); *G01K 3/06* (2013.01); *G01K 13/024* (2021.01); *G01R 15/16* (2013.01); *H02B 13/0352* (2013.01)

(58) Field of Classification Search
USPC ......................................... 324/105
See application file for complete search history.

(56) References Cited

U.S. PATENT DOCUMENTS

| | | | |
|---|---|---|---|
| 2020/0303784 A1* | 9/2020 | Ruehle ................... | H05K 1/181 |
| 2023/0022633 A1* | 1/2023 | Bhutada ................. | G01R 15/04 |

FOREIGN PATENT DOCUMENTS

| | | |
|---|---|---|
| EP | 3276363 A1 | 1/2018 |
| JP | 4495103 B3 | 6/2010 |
| KR | 101287906 B1 | 7/2013 |

OTHER PUBLICATIONS

Extended European Search Report issued in EP Application No. 23305277.8 dated Aug. 24, 2023, 8 pages.

* cited by examiner

*Primary Examiner* — Farhana A Hoque
(74) *Attorney, Agent, or Firm* — Eversheds Sutherland (US) LLP

(57) ABSTRACT

A capacitive sensor having a cylindrical capacitor, for a conductor of a GIS. The capacitive sensor having at least two digital or analog temperature sensors.

14 Claims, 5 Drawing Sheets

360 deg 270 deg 180 deg 90 deg 0 deg

DEVICE FOR MEASURING TEMPERATURE GRADIENTS APPLIED TO A PRECISION CAPACITIVE DIVIDER VOLTAGE SENSOR

TECHNICAL FIELD

Capacitive sensors are known to measure voltages in Gas Insulated Switchgears (GIS).

BACKGROUND

An example of such a sensor is disclosed in the article by R. Christen et al. "Optimized LPIT (Low power instrument transformer) applications in GIS using $SF_6$ and climate friendly insulating gas $g^3$" in CIGRE, Session 2022, A3-659.

FIGS. 9A and 9B show a capacitive divider for a GIS according to the above-mentioned article. It is for being arranged concentric around a high-voltage primary conductor inside the gas compartment of a GIS. The high-voltage conductor and the electrode form the high-voltage capacitance part $C_1$ of the divider. The electrode is arranged on a PCB and separated from the enclosure $C_3$. A signal amplification and the precision capacitor $C_2$ can be implemented in the main electronic measuring path. FIG. 9B shows the measurement electrode for a single-phase bus.

If the temperature $T_0$ at the bottom of the capacity (or the measurement electrode) is less than the temperature $T_1$ at the top, the voltage measured by the sensor is not accurate because of the different thermal expansions of the different parts of the capacity. There is thus a problem of increasing the precision of the voltage measured by a capacitive sensor in a GIS.

SUMMARY

The present invention first concerns a capacitive sensor, which can be on a board, for example a printed circuit board, comprising at least 2 digital or analogue temperature sensors.

The invention makes it possible to measure an average temperature on a voltage sensor of the capacitive type, in particular of a large diameter, for example 200 mm or 450 mm of diameter or more, in order to obtain a more accurate temperature compensated voltage. The signals measured by a voltage sensor can thus be compensated based on the temperature gradients measured by the temperature sensors.

The invention improves the accuracy of a voltage sensor for a GIS.

The invention is particularly useful when the voltage sensor is located in an environment where significant temperature gradients can exist and the accuracy constraints are high. With the present invention the accuracy class 0.2 for measuring can be achieved even in presence of temperature gradients. This is more easily achieved in an environment where the temperature is homogeneous than in the presence of gradients. In the presence of significant temperature gradients, a distributed temperature measurement according to the invention contributes to better accuracy and is one of the conditions which makes it possible to reach a more demanding accuracy class.

The capacitive sensor may comprise one or two electrodes, each being able to be arranged around a conductor for measuring the voltage therein.

In an embodiment a capacitive sensor according to the invention comprises a plurality of analog temperature sensors, which can be equivalent to an average sensor.

In another embodiment a capacitive sensor according to the invention comprises a plurality of digital temperature sensors.

In both cases the temperature sensors can be distributed over 360°, preferably regularly, around the capacitive sensor.

One or more of the temperature sensor(s) can be:

separated from other parts of the sensor, for example from a board on which it is made, by a gap, preferably on two lateral sides, so that it is not affected by mechanical constraints of the rest of the capacitor.

and/or protected from the electric field by a metal screen.

A capacitive sensor according to the invention can be provided with means, for example a calculator or a processor or a microprocessor or a computer:

for estimating or calculating a temperature gradient between the at least two temperature sensors and/or an average temperature measured by the at least two sensors;

and/or for estimating or calculating the temperature at the location of each temperature sensor;

and/or for establishing a set of data or a map of the temperature distribution;

and/or for correcting or compensating the voltage value measured by the capacitive sensor on the basis of the geometrical and/or physical parameters of the divider and/or possibly of the temperature measurements of at least two temperature sensors and/or of the temperature gradient between said at least two temperature sensors and/or of the average temperature measured with said at least two temperature sensors and/or of the variation of said geometrical parameters due to dilatation resulting from the temperature; such correction or compensation can be performed by computing or calculating means, for example a calculator or a processor or a microprocessor or a computer, to which the temperature data measurements are provided and programmed to implement said correction or compensation accordingly.

The invention applies to a single-phase conductor or to each phase of a system having several, for example 3, phases.

The invention also concerns a single-phase GIS, comprising a conductor and a capacitive sensor according to the invention provided around said conductor.

It also concerns a 3 phase GIS, comprising 3 conductors and a capacitive sensor according to the invention around each conductor.

In a GIS according to the invention, at least one temperature sensor can be located below, or at the bottom of, the conductor or below, or at the bottom of, each conductor, and at least one temperature sensor can be located above, or at the top of, the conductor or above, or at the top of, each conductor.

In a GIS, the invention contributes to guarantee the accuracy of the voltage sensor while the GIS is under rated current load with a lot of internal thermal dissipation or in outdoor application where it is subject to sun radiation.

The load currents, i.e. the permanent currents which circulate inside a GIS conductor, can be between zero and thousands of amperes, for example 5000A (sometimes more, for example up to 6000 A). These currents circulate in a conductor whose resistance, over a given length and depending on the connections at the ends, is measured in ohms. The power dissipated is then equal to the resistance multiplied by the square of the current. For example with a current of 4000 A and a resistance of 30 micro ohms we obtain a power of heating (in Watts) of 0,000030 Ohms×4000×4000=480 W. This is sufficient to significantly heat a volume of gas contained in the GIS. Mainly due to the phenomenon of convection, the heat generated at the level of the bar causes the hot gas to rise towards the top of the envelope. The voltage sensor, which is located around this envelope, is then forced to withstand a temperature difference of several degrees.

The invention contributes to a more accurate energy metering.

The invention also concerns a voltage measuring system comprising a voltage sensor according to the invention and computing or calculating means, for example a calculator or a processor or a microprocessor or a computer, to which the temperature data measurements are provided and programmed accordingly to estimate or calculate a voltage in a conductor based on the measurements provided by the voltage sensor and possibly to correct or compensate the voltage as explained above.

The invention also concerns a method for measuring a voltage in a conductor, for example in a GIS, for example a GIS according to the invention, comprising measuring a voltage circulating in said conductor with a voltage sensor according to the invention, measuring temperatures with each of said at least two temperature sensors of said voltage sensor, and compensating said measured voltage on the basis of said temperatures and/or on the basis of the temperature gradient between said two temperature sensors and/or of an average temperature measured with said at least two temperature sensors.

A method according to the invention can comprise establishing a set of data or a map of the temperature distribution and calculating or estimating one or more temperature gradients based on said set of data or map.

A method according to the invention can comprise a previous step of measuring several voltages in said conductor with the voltage sensor, measuring several temperature gradients between said at least two temperature sensors and/or several average temperatures with said at least two temperature sensors, comparing said temperature gradients and/or said average temperatures and said measured voltages with at least one standard voltage in said conductor, and establishing a relationship between temperature gradient and/or average temperature and voltage.

4

DETAILED DESCRIPTION

Figure 1A:
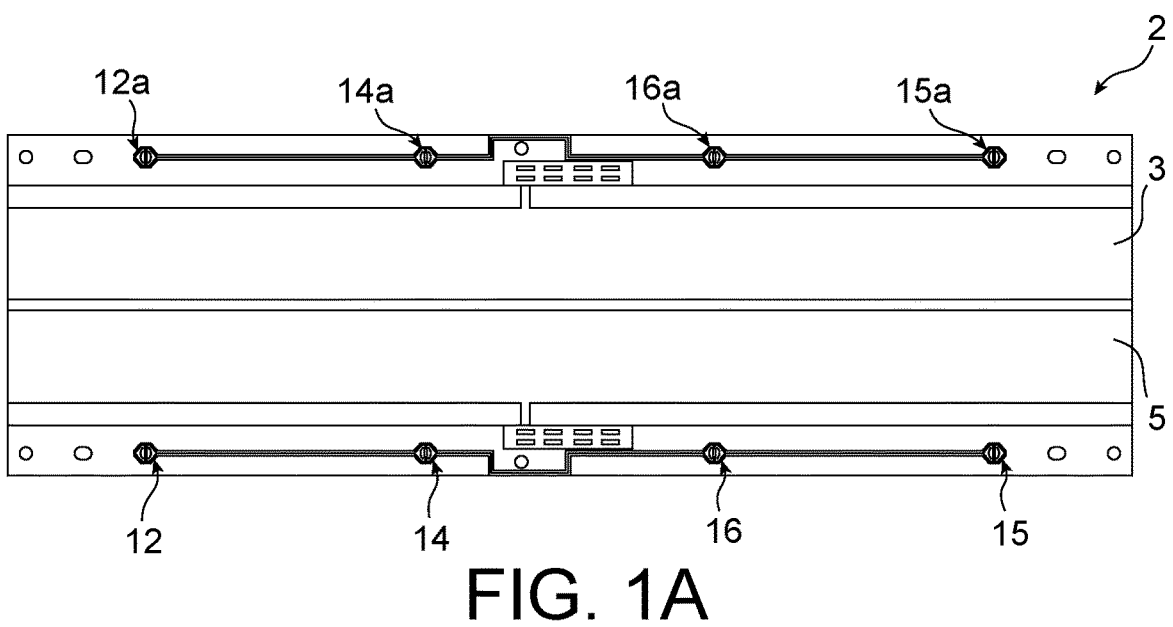
FIGS. 1A and 1B show an embodiment of a voltage sensor according to the invention.
Figure 1B:
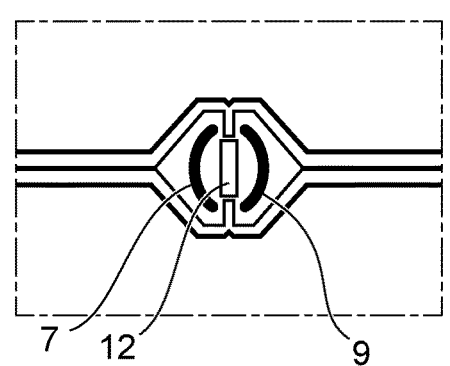

An embodiment of the present invention is shown on FIGS. 1A and 1B: it comprises electrodes 3, 5 for a double capacitive sensor 2. These electrodes can be arranged concentric around a conductor as illustrated on FIG. 2. The invention also applies to a simple capacitive sensor, comprising one electrode (3 or 5) only; in a GIS there may be a need for 2 voltage sensors, one for the main circuit and one for a backup circuit, therefore the 2 electrodes 3, 5 on FIGS. 1A and 1B.

The 2 electrodes 3, 5 can for example be made of copper or a mixture of copper and gold. The electrodes can be formed on a board, for example on a PCB.

Figure 2:
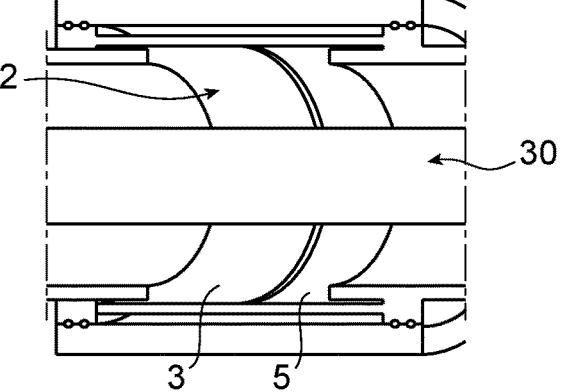
FIG. 2 show an embodiment of a voltage sensor according to the invention around a conductor of a GIS.
Figure 9A:
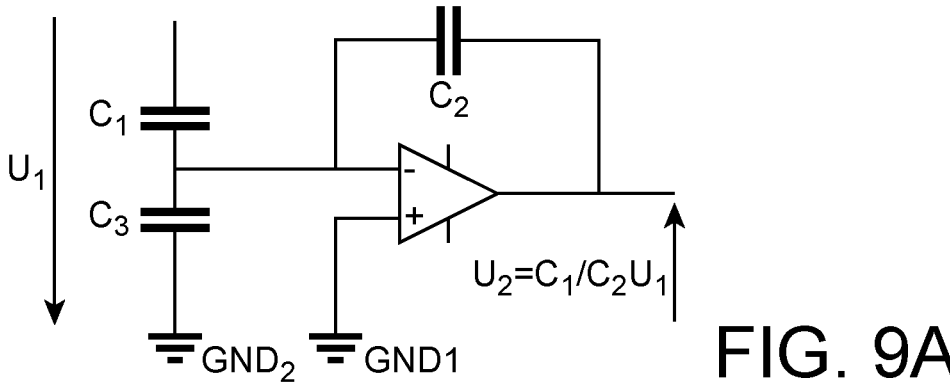
FIGS. 9A and 9B show a voltage sensor according to the prior art.
Figure 9B:
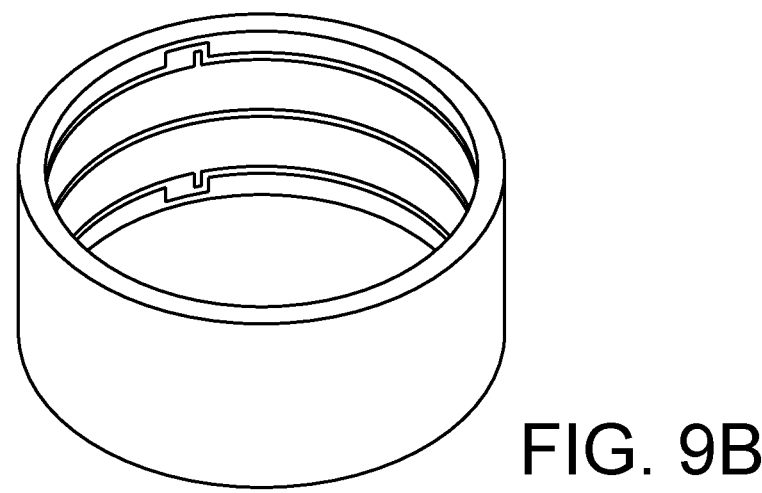
Figure 10:
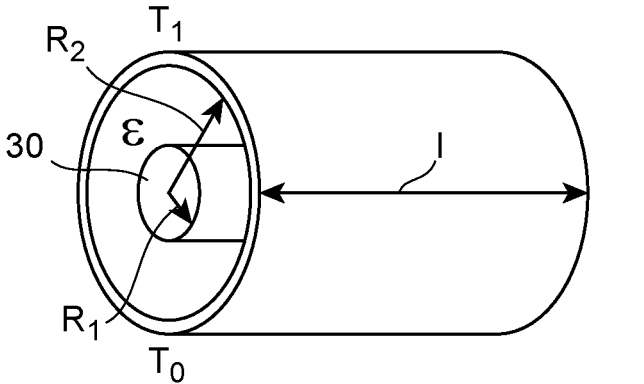
FIG. 10 shows parameters of a voltage sensor in a GIS.

On FIG. 2, reference 30 is a conductor, for example a GIS conductor, in which a current circulates. The capacitive sensor of FIG. 1A can be arranged around the conductor 30 for measuring the voltage in said conductor. Based on the diagrams of FIGS. 9A and 10, the primary voltage $U_1$ is given by:

$$U_2/U_1 = C_1/C_2$$

The value $C_1$ of the primary capacitor is given by:

$$C_1 = 2\pi\varepsilon_0\ \varepsilon_r l\ (1 + \alpha(T - T_0))/(\ln(R_2/R_1),$$

with:

l=length of the electrode;

$R_1$=diameter of the conductor 30 (in mm);

$R_2$=diameter of the electrode (in mm);

$\varepsilon_0$=permittivity of vacuum;

$\varepsilon_r$=permittivity of the gas;

$U_2$=measured voltage.

$U_1$=primary voltage.

α=coefficient of thermal expansion of the material of the electrode.

l, as well as radius $R_1$, radius $R_2$ and gas relative permittivity $\varepsilon_r$, are affected by the temperature.

$C_1$ is therefore affected by a temperature difference $T-T_0$ between two different parts of the electrodes 3, 5 and in particular between the bottom and the top of the capacitor. This affects the ratio of the capacity $C_1/C_2$ and finally the sensitivity of the voltage divider.

$C_2$ is often located in a separate chamber and is less sensitive to temperature than $C_1$.

The capacitive sensor 2 ($C_1$) is provided with several temperature sensors, for example at least 4 temperature sensors 12, 12a, 14, 14a, 16, 16a, 18, 18a, on at least one of its lateral sides, preferably on each side of the electrodes (as in the example of FIG. 1A); preferably said sensors are resistors.

A temperature sensor can comprise a platinum resistor, for example of 100Ω or 1000Ω, and/or of the SMD type (Surface Mounted Detector). A sensor based on a resistor depends on the temperature, in particular for the «PT100» or «PT1000» type, the values of 100Ω and 1000Ω being usually given at 0° C. V.

FIG. 1B shows a detail of an embodiment of the sensor 12 of FIG. 1A, namely a temperature sensor of the SMD type. It is partly surrounded by a gap 7, 9, preferably on two lateral sides, so that it is not affected by mechanical constraints of the rest of the capacitor, for example of the board. All the sensors 12-18, 12a-18a may have identical or similar implementations, for example as on FIG. 1B.

In addition one or more of the sensors 12, 12a, 14, 14a, 16, 16a, 18, 18a may be protected from the electric field by a metal screen (not shown on the figures) which is kept above but at some distance from the sensor.

As can be understood from the example of FIGS. 1A and 1B the temperature sensor can measure temperature directly in the gas of the GIS.

Figure 3:
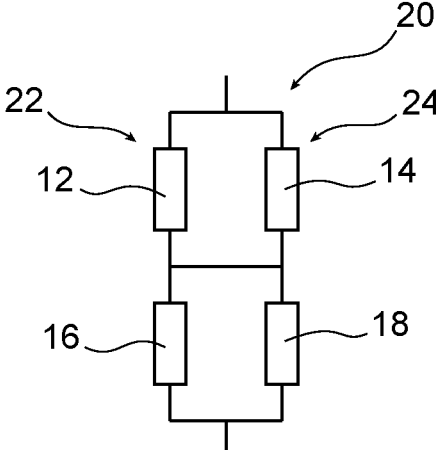
FIG. 3 shows a bridge connection of temperature sensors of a voltage sensor according to the invention.
Figure 4:
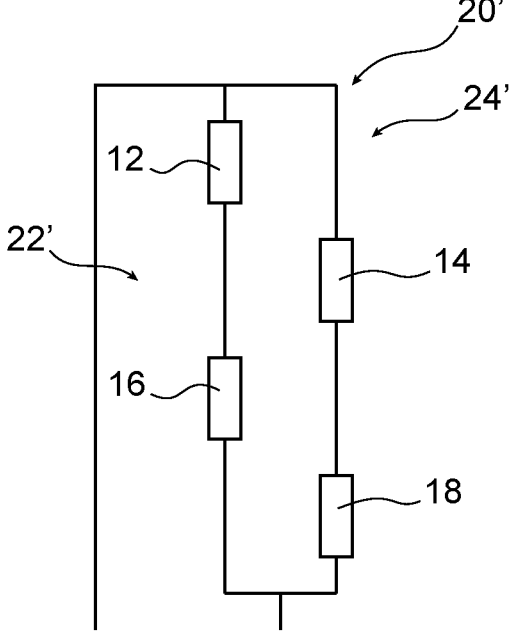
FIG. 4 shows another bridge connection of temperature sensors of a voltage sensor according to the invention.

The temperature sensors 12-18 (12a-18a) may be connected as illustrated on FIG. 3 or on FIG. 4, arranged in a bridge 20, 20' comprising two legs 22 (22'), 24 (24') in parallel, each leg comprising two of said temperature sensors, actually resistors. If all resistors have the same value, this bridge allows a measure of an average temperature to be carried out at 4 different locations, with a system having an equivalent impedance value equal to that of a single resistor (for example 100Ω at 0° C., for example "PT100" resistors). A single temperature probe, used to provide compensation for the voltage measurement, would indicate a temperature value at only one location, which is not the average temperature of the sensor. This introduces a compensation error and therefore a measurement error.

Alternatively, 3 sensors could be implemented instead of 4, but at least 4 sensors are preferred.

Figure 5:
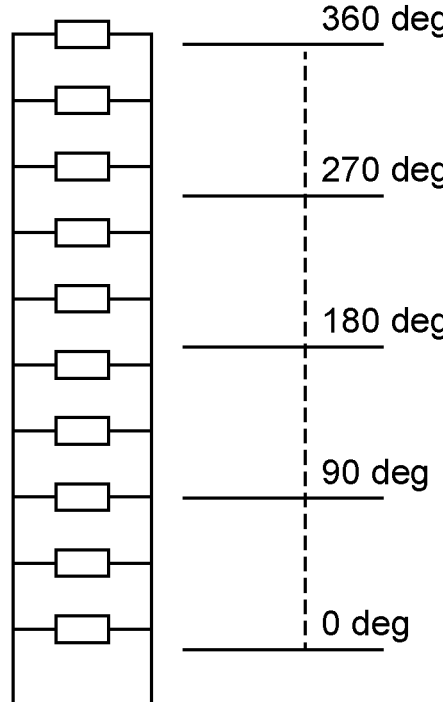
FIG. 5 shows a series connection of temperature sensors of a voltage sensor according to the invention.

Another electric connection of the sensors is the one illustrated on FIG. 5, in which several sensors, for example resistors of each 1000Ω (at 0° C., for example "PT1000" resistors), are connected in parallel. For example, 10 such sensors are positioned at regular intervals along each side of the electrode of FIG. 1A.

Figure 6:
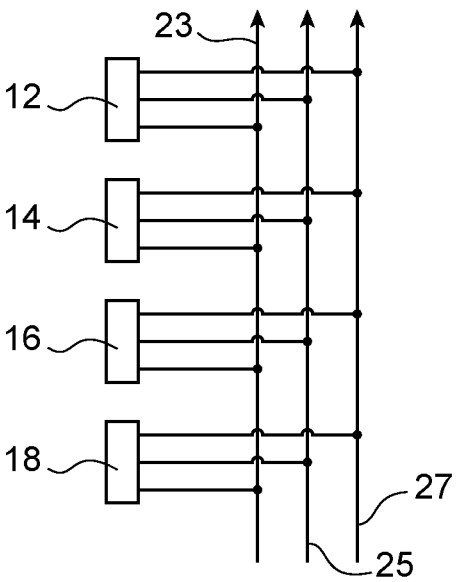
FIG. 6 shows a daisy chain connection of temperature sensors of a voltage sensor according to the invention.

Another electric connection of the sensors is the one illustrated on FIG. 6, in which several sensors, 4 in this example, are connected in a "daisy chain" or "in parallel". In this case each temperature sensor has a digital address and the communication between the acquisition unit and the sensors is done digitally. It is then possible to measure temperature gradients for advanced monitoring functions. Thus, the temperature at the location of each sensor can be measured, as well as the average temperature measured by all sensors. For example, 10 such sensors can be positioned at regular intervals along each side of the electrodes 3, 5 of FIG. 1. Each sensor can be connected to a ground line 23, a voltage supply line 27 (for example+5V) and a signal line 25.

Preferably, at least one temperature sensor is located under conductor 30 and at least one above said conductor 30, so that the temperature gradient between the bottom and the top of the conductor can be estimated or measured (the hot gas rise from the bottom towards the top of the conductor, so that the temperature above the upper part of the conductor is more prone to be higher than at the bottom of the conductor). "Under" and "above" refer to the vertical direction of the location of the conductor, the hot gas rising along that vertical direction, from below the conductor or from the bottom of the conductor to above the conductor or to the top of the conductor.

In any embodiment according to the invention, the signal from each sensor can be provided to a control unit, for example a computer or a microprocessor, to sample and/or process it and to provide a temperature information.

Figure 7:
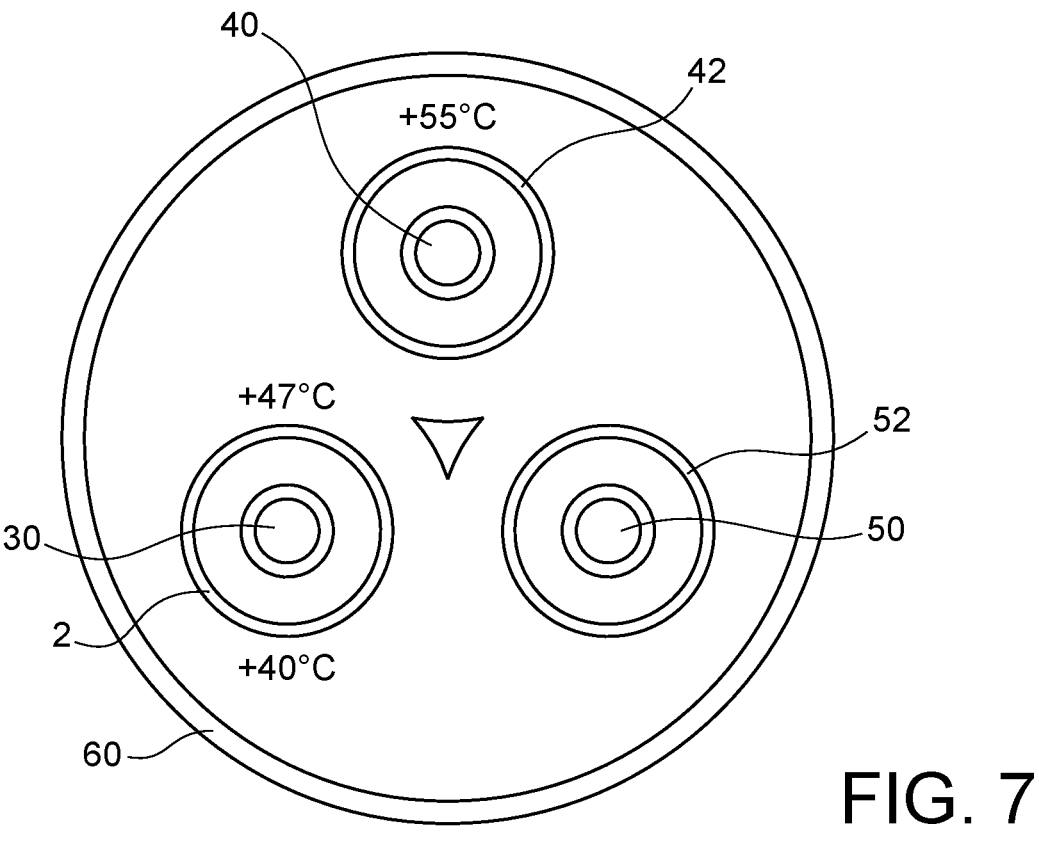
FIG. 7 shows a 3-phase system, comprising 3 conductors, each associated with a voltage sensor according to the invention.

FIG. 7 represents an enclosure containing 3 conductors 30, 40, 50, for example conductors of a 3-phase system, a capacitive sensor 2, 42, 52 according to the invention being implemented around each of said conductors. There may be temperature gradients in the enclosure 60, as a result of internal dissipation from primary current in each of said conductors and/or due to sun radiation on the enclosure. For example, the bottom of the enclosure may be at a temperature of about 40° C., the middle part being for example at 47° C. and the upper part at about 55° C.

Figure 8:
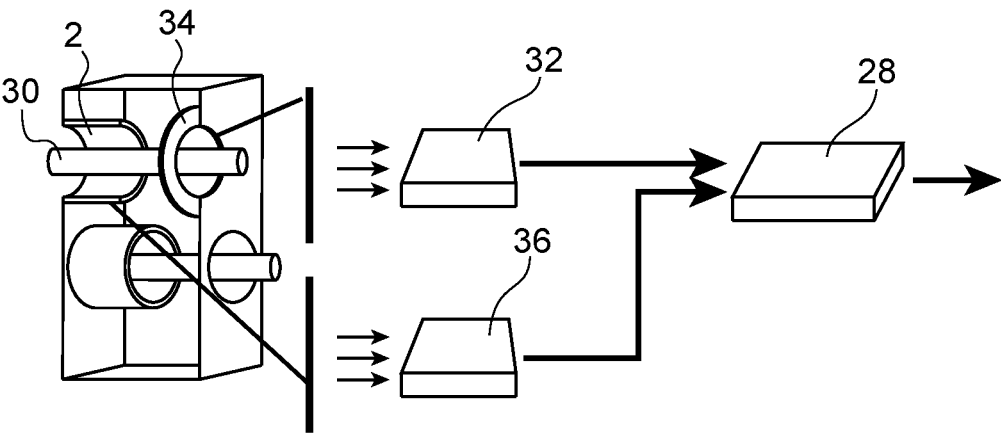
FIG. 8 shows a measuring system associated with a voltage sensor according to the invention.

FIG. 8 represents a capacitive sensor 2 according to the invention implemented around a conductor 30. The signals from said capacitive sensor can be sent to a converter 32 to convert said signal into optical signals. Other signals from one or more other sensor(s), for example a Rogowski coil 34 (for measuring a current circulating in conductor 30), can also be converted by a converter 36 into optical signals. The optical signals can be merged in a merging unit 28. The merging unit can comprise a microprocessor to process data and has calculation capabilities that allow it to perform voltage and/or measurement compensation at least from temperature gradient information and/or from an average temperature estimated from the data provided by the several temperature sensors and/or from the temperature information provided by the several temperature sensors. The relationship for example between the temperature gradient and/ or the average temperature and/or the temperature information provided by the several temperature sensors and its influence on the measured voltage can be measured in real time and then for example converted into a mathematical law which is recorded or accessible from a software in order to obtain an accurate voltage measurement.

The same measuring system may be implemented for several capacitive sensors, like for example on FIG. 7. The voltage value measured by one or more capacitive sensor(s) according to the invention can be compensated on the basis of the temperature measurements of the temperature sensors and/or on the basis of an average temperature measured by said sensors and/or on the basis of a temperature gradient between at least two sensors. The compensation can be performed by multiplying the measured voltage by a gain which depends on the temperature; this gain can be calculated or measured by one or more test measurement(s). Alternatively, a calculator or a processor or a microprocessor or a computer can be implemented instead of a merging unit, programmed to implement a method or a process according to the invention.

The influence of temperature on the voltage can be measured during a test. Several voltages can be measured for several temperature gradients and/or several average temperatures and/or several temperature data provided by at least two temperature sensors. The measurements can be compared to one or more voltage standard(s). This makes it possible to deduce a relationship, for example a mathematical law, between the voltage and the average temperature or the temperature gradient (the average temperature being preferred because easier to implement than the temperature gradient). This relationship, can then be used to correct the measured voltage, this correction being for example performed by a software.

The average temperature is the average temperature between different zones of the sensor.

Measuring the temperature, preferably with digital sensors, at different points or zones allows establishing a set of data or a map of the temperature distribution and identifying the temperature gradients; it also helps in detecting possible abnormal hot points.

But a capacitive sensor is sensitive to temperature and a compensation of the measured voltage $U_1$ as a function of the temperature is therefore preferred for a better precision.

Thus, if different temperatures t1 and t2 are measured on each side of a capacitive sensor, using only one of t1 and t2 to correct the measurement of voltage $U_1$ in the sensor results in a wrong correction (the voltage is overcompensated or undercompensated). A temperature difference between the upper part and the lower part of the capacitive sensor can also have an effect on its sensitivity, as can be understood on the basis on the above formula of $C_1$.

Therefore, in case of a temperature difference between different parts of the capacitive sensor, a single temperature sensor is not enough. In an embodiment, the invention implements measuring an average temperature to compensate the measured voltage $U_1$, which results in a more precise compensation or correction. In case of digital sensors, said average temperature can be equal to the sum of the measured temperatures divided by the number of sensors.

For example, the voltage which is measured can drift or vary approximately linearly according to the temperature with a slope of about some ppm/° C. between −40° C. and +80° C. A slope of that order can be compensated, for example by merging unit 28 or, more generally, by means, for example, of a calculator or a processor or a microprocessor or a computer to which the temperature data measurements are provided and programmed accordingly.

It is be possible to implement an alarm threshold, for example if the temperature at a point has reached an excessive value with regard to the material used in a sensor according to the invention.

We claim:

1. A GIS containing a gas and comprising at least one conductor and at least one capacitive sensor comprising a cylindrical capacitor, arranged around the conductor, the sensor comprising at least two digital or analogue temperature sensors whereby the temperature sensors can measure the temperature directly in the gas of the GIS; and
    means for estimating or calculating a temperature gradient between the at least two temperature sensors and/or an average value of the temperatures measured by the at least two temperature sensors.

2. A GIS as in claim 1, wherein the at least two digital or analogue temperature sensors are regularly positioned along or around the cylindrical capacitor.

3. A GIS as in claim 1, comprising four analogue temperature sensors, comprising two groups of two of the sensors connected in series, the two groups being connected in parallel.

4. A GIS as in claim 1, comprising n (n>2) analogue temperature sensors connected in parallel.

5. A GIS as in claim 1, comprising n (n>2) digital temperature sensors, connected in daisy chain.

6. A GIS as in claim 1, further comprising means for estimating or calculating the temperature at the location of each of the temperature sensors.

7. A GIS as in claim 6, further comprising means for establishing a set of data or a map of the temperature distribution.

8. A GIS as in claim 1, the sensor having an external diameter of at least 200 mm.

9. A GIS as in claim 1, comprising a single conductor, the GIS being a single-phase GIS, the cylindrical sensor being arranged around the conductor.

10. A GIS according to claim 9, at least one temperature sensor being located below, or at the bottom of, the conductor or below, or at the bottom of, each conductor, and at least one temperature sensor being located above, or at the top of, the conductor or above, or at the top of, each conductor.

11. A GIS as in claim 1, comprising three conductors, the GIS being a three-phase GIS, and three capacitive sensors, a capacitive sensor being arranged around each of the conductors.

12. A GIS containing a gas and comprising at least one conductor and at least one capacitive sensor comprising a cylindrical capacitor, arranged around the conductor, the senso comprising at least two digital or analogue temperature sensors whereby the temperature sensors can measure the temperature directly in the gas of the GIS; and
    further comprising means for compensating the voltage value measured by the capacitive sensor on the basis of the geometrical parameters of the capacitor, and possibly of the temperature measurements of at least two temperature sensors and/or of the temperature gradient between the at least two temperature sensors and/or of the average temperature measured with the at least two temperature sensors and/or of the variation of the geometrical parameters due to dilatation resulting from the temperature.

13. A method for measuring a voltage in a conductor of a GIS according to claim 9, comprising measuring at least one voltage with the capacitive sensor, measuring at least one temperature with each of the at least two sensors, calculating at least one temperature gradient between the at least two sensors and/or at least one average temperature on the basis of the temperatures provided by each of the at least two sensors and compensating and/or correcting the measured voltage on the basis of the temperature gradient and/or the average temperature.

14. A method according to claim 13, previously comprising measuring several voltages with the capacitive sensor, measuring several temperature gradients between the at least two temperature sensors and/or several average temperatures with the at least two temperature sensors, comparing the temperature gradients and/or the average temperatures and the measured voltages with at least one standard voltage in the conductor, and establishing a relationship between temperature gradient and/or average temperature and voltage.

\* \* \* \* \*